(12) United States Patent
Hsueh et al.

(10) Patent No.: US 10,281,815 B2
(45) Date of Patent: May 7, 2019

(54) RETICLE POD

(71) Applicant: GUDENG PRECISION INDUSTRIAL CO., LTD, New Taipei (TW)

(72) Inventors: Hsin-Min Hsueh, New Taipei (TW); Chia-Ho Chuang, New Taipei (TW); Cheng-Ju Lee, New Taipei (TW); Jeng-Jie Huang, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 0 days.

(21) Appl. No.: 15/651,399

(22) Filed: Jul. 17, 2017

(65) Prior Publication Data
US 2018/0210334 A1 Jul. 26, 2018

Related U.S. Application Data

(60) Provisional application No. 62/450,871, filed on Jan. 26, 2017.

(51) Int. Cl.
*G03F 1/66* (2012.01)
*B65D 25/10* (2006.01)
*B65D 85/38* (2006.01)
*H01L 21/673* (2006.01)

(52) U.S. Cl.
CPC .............. *G03F 1/66* (2013.01); *B65D 25/10* (2013.01); *B65D 85/38* (2013.01); *H01L 21/67359* (2013.01); *H01L 21/67366* (2013.01); *H01L 21/67376* (2013.01)

(58) Field of Classification Search
CPC .......... G03F 1/66; H01L 21/67359; H01L 21/67363; H01L 21/67383; H01L 21/67366; B65D 85/38; B65D 25/10
USPC ..... 206/316.1, 722, 723, 710, 454, 453, 455
See application file for complete search history.

(56) References Cited

U.S. PATENT DOCUMENTS

| 8,083,063 B2 | 12/2011 | Lu et al. |
|---|---|---|
| 2011/0155598 A1 | 6/2011 | Lu et al. |
| 2012/0037522 A1 | 2/2012 | Chiu et al. |

FOREIGN PATENT DOCUMENTS

| CN | 202956584 U | 5/2013 |
|---|---|---|
| TW | M335007 U | 6/2008 |
| TW | 201111244 A | 4/2011 |
| TW | 201121854 A | 7/2011 |
| TW | M409519 U | 8/2011 |
| TW | I370093 B | 8/2012 |
| TW | I378887 B | 12/2012 |
| TW | I391304 B | 4/2013 |
| TW | I535642 B | 6/2016 |

*Primary Examiner* — Steven A. Reynolds
(74) *Attorney, Agent, or Firm* — Muncy, Geissler, Olds & Lowe, P.C.

(57) ABSTRACT

A reticle pod for accommodating a reticle is provided. The reticle pod comprises a base; a cover; and at least one supporting member. When the reticle is accommodated on the reticle pod, the supporting member abuts against the reticle through a protrusion part; wherein the maximum static friction is constantly greater than a horizontal force applied to the support module from the reticle.

20 Claims, 9 Drawing Sheets

RETICLE POD

CROSS REFERENCE TO RELATED APPLICATION

This application claims the benefit of filing date of U.S. Provisional Application Ser. No. 62/450,871 filed on Jan. 26, 2017, the subject matter of which is incorporated herein by reference.

BACKGROUND OF THE INVENTION

1. Field of the Invention

The present invention relates to a reticle pod, particularly, to a reticle pod having a plurality of supporting member for supporting the reticle.

2. Description of Related Art

Optical lithography plays an important role in the semiconductor industry. The reticle used for patterning should be spotless, any kind of dust particles that adhere to the reticle or scratches may result in quality degradation of the projected pattern, therefore, the reticle is required to be absolutely dust-free during the processes of manufacturing, processing, shipping, transporting, and storing, any collision or friction that might affect the clarity of the reticle should be prevented.

Typically, the reticle should be stored in a reticle pod for transporting process to avoid contaminations. The reticle should be firmly fixed in the reticle pod to prevent any damage caused by friction or displacement. Also, the contact area between the reticle pod and the reticle should be smaller in order to prevent damages caused by contact or friction between the reticle and the reticle pod.

For example, TW Patent No. 1391304 disclosed a reticle pod having a base, wherein the base has a flat polished surface with a protrusion, the cover has a ball for contacting the reticle, therefore, when the reticle is received in the reticle pod, the protrusion of the base supports the reticle from below and guides the reticle to its position and the ball of the cover contact with the reticle from above. However, during the transporting process, the displacement between the reticle and the protrusion and between the reticle and the balls may produce dust particles that contaminate the reticle.

Accordingly, a novel reticle pod is required, which comprises a novel supporting module that can accurately locate the position of the reticle in the reticle pod and absorb the vibration during the transporting process in order to prevent any collision or friction between the reticle and the reticle pod that might affect the clarity of the reticle.

SUMMARY OF THE INVENTION

To achieve the object mentioned above, the present invention provides a reticle pod for receiving a reticle, a base; a cover corresponding to the base engaging with respect to the base; and at least one supporting module disposed on the base. The supporting modules include a box having an opening; a supporting member having a protruding part and a main body and being disposed in the box with a portion of the protruding part protrudes out of the box through the opening; and a plurality of shifting members being disposed between the box and the main body; wherein the supporting member moves correspondingly to the box in a horizontal direction through the shifting members. When the reticle is received in the reticle pod, the supporting module abuts against the reticle through the protruding part; and a maximum static friction between the reticle and the protruding part is greater than a horizontal force applied to the protruding part generated by the reticle.

In one embodiment of the present invention, a coefficient of friction μ between the protruding part and the reticle is 0.5-6; and an arithmetic mean roughness value Ra of the protruding part is 8-25 μm.

In one embodiment of the present invention, any friction or displacement between the supporting member and the reticle does not occur.

In one embodiment, the supporting member is made of a plastic material which is selected from the group consisting of polyvinyl chloride (PVC), poly (methyl methacrylate) (PMMA), polystyrene (PS), polyamide (PA), polyethylene (PE), polytetrafluoroethylene (PTFE), polypropylene (PP), acrylonitrile-butadiene-styrene copolymer (ABS), phenol formaldehyde resin (PF), urea resin (UF), melamine resin (MF), unsaturated polyester (UP), epoxy resin (EP), polyurethane (PU), polycarbonate (PC), polybutylene terephthalate (PBT), Nylon-66 (PA-66), Nylon-6 (PA-6), polyoxymethylene (POM), polyphenylene sulfide (PPS), polyether ether ketone (PEEK), polyamide-imide (PAI), polyetherimide (PEI), polyimide (PI), and mixture thereof. However, the supporting member is preferably made of PEEK.

In one embodiment, the supporting member further comprises a contact element disposed on the top of the protruding part for contacting the reticle, wherein a coefficient of friction μ between the contact element and the reticle is 0.5-6; and an arithmetic mean roughness value Ra of the contact element is 8-25 μm.

In one embodiment, the contact element is made of silicone.

In one embodiment, when the reticle is received in the reticle pod, the reticle does not contact with the base and a gap between the reticle and the base is 0.05-0.3 mm, wherein the gap between the reticle and the base is preferably 0.1 mm.

In one embodiment, the shifting members are balls, and ball slots corresponding to each of the balls are formed on the box or the main body of the supporting element for the balls to be embedded thereinto.

In one embodiment, the shifting members are cylinders, and cylinder slots corresponding to each of the cylinders to be embedded thereinto.

In one embodiment, the shifting members are rollers disposed on the box or the main body, and between the box and the supporting element.

In one embodiment, the box further includes a plurality of dust extraction channel extends through a bottom side of the box.

In one embodiment, the reticle pod further comprises a filter membrane disposed on the bottom side of the box and covering the dust extraction channels from underneath.

In one embodiment, each of the shifting members is configured with a first magnetic element and a second magnetic element, wherein the first magnetic element and a second magnetic element in each of the shifting member are magnetically attracted or repulsive in order to separate the supporting member and the box.

In one embodiment, the shifting member is a fluid, the fluid is accommodated in the box, and the reticle pod further comprises a sealing member disposed at the opening of the box so that the fluid does not leak from the opening.

In one embodiment, the fluid is selected from the group consisting of hydraulic oil, lubricating oil, mercury, and mixture thereof.

In one embodiment, the supporting member further comprises at least one spacer formed on a side surface of the main body and contact the box to separate the main body and the box.

In one embodiment, the spacer is made of an elastic material.

DETAILED DESCRIPTION OF THE PREFERRED EMBODIMENT

Hereafter, examples will be provided to illustrate the embodiments of the present invention. Advantages and effects of the invention will become more apparent from the disclosure of the present invention. It should be noted that these accompanying figures are simplified and illustrative. The quantity, shape, and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

Figure 1:
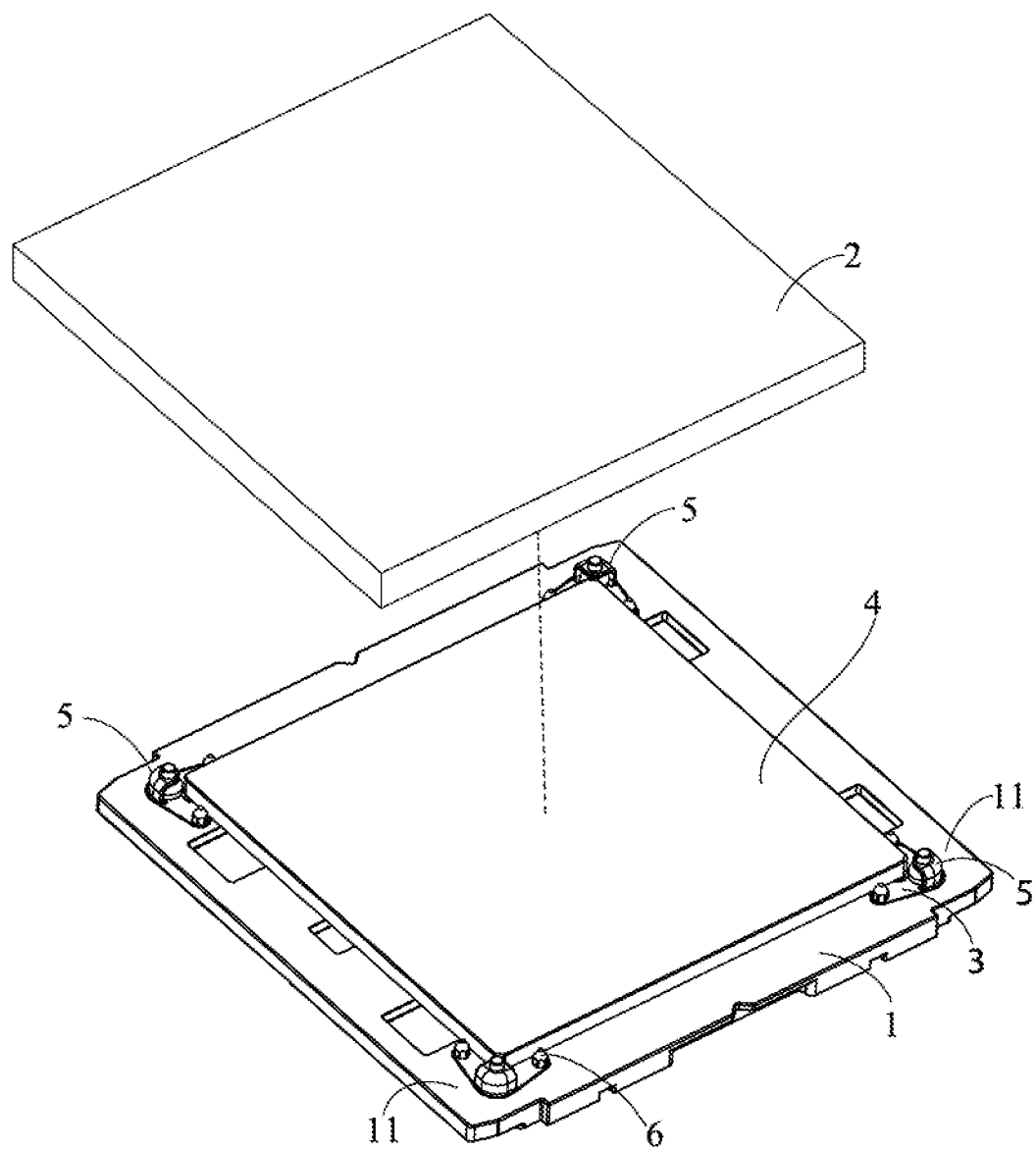
FIG. 1 is a perspective view of the reticle pod of one embodiment of the present invention.

The reticle pod 1000 of a preferred embodiment of the present invention is illustrated in FIG. 1. The reticle pod 1000 comprises a base 1, a cover 2, four supporting modules 3, a reticle 4, four positioning modules 5, and eight locators 6. Wherein the reticle 4 is placed on the base 1 and is positioned by four positioning module 5 and eight locators 6 that are disposed respectively on four of the vertex portions 11 of the base 1. In addition, the cover 2 opposes to the base 1 and may engage with the base 1 to accommodate the reticle 4.

Figure 2:
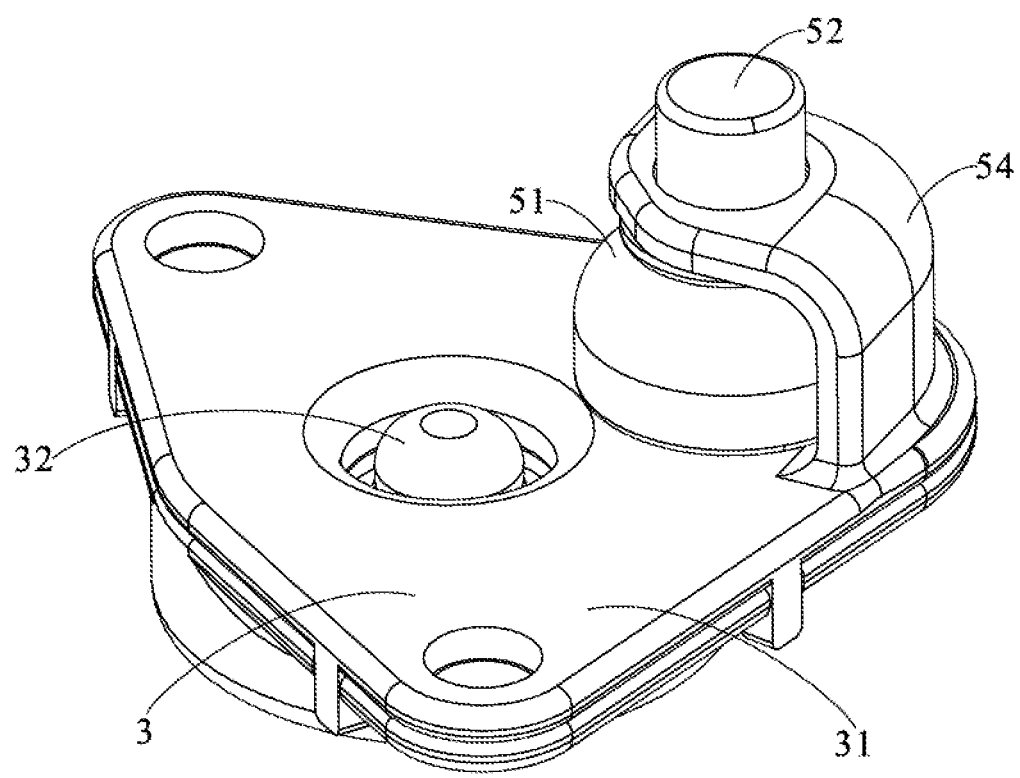
FIG. 2 is a perspective view of the positioning module and the supporting module of one embodiment of the present invention.
Figure 3:
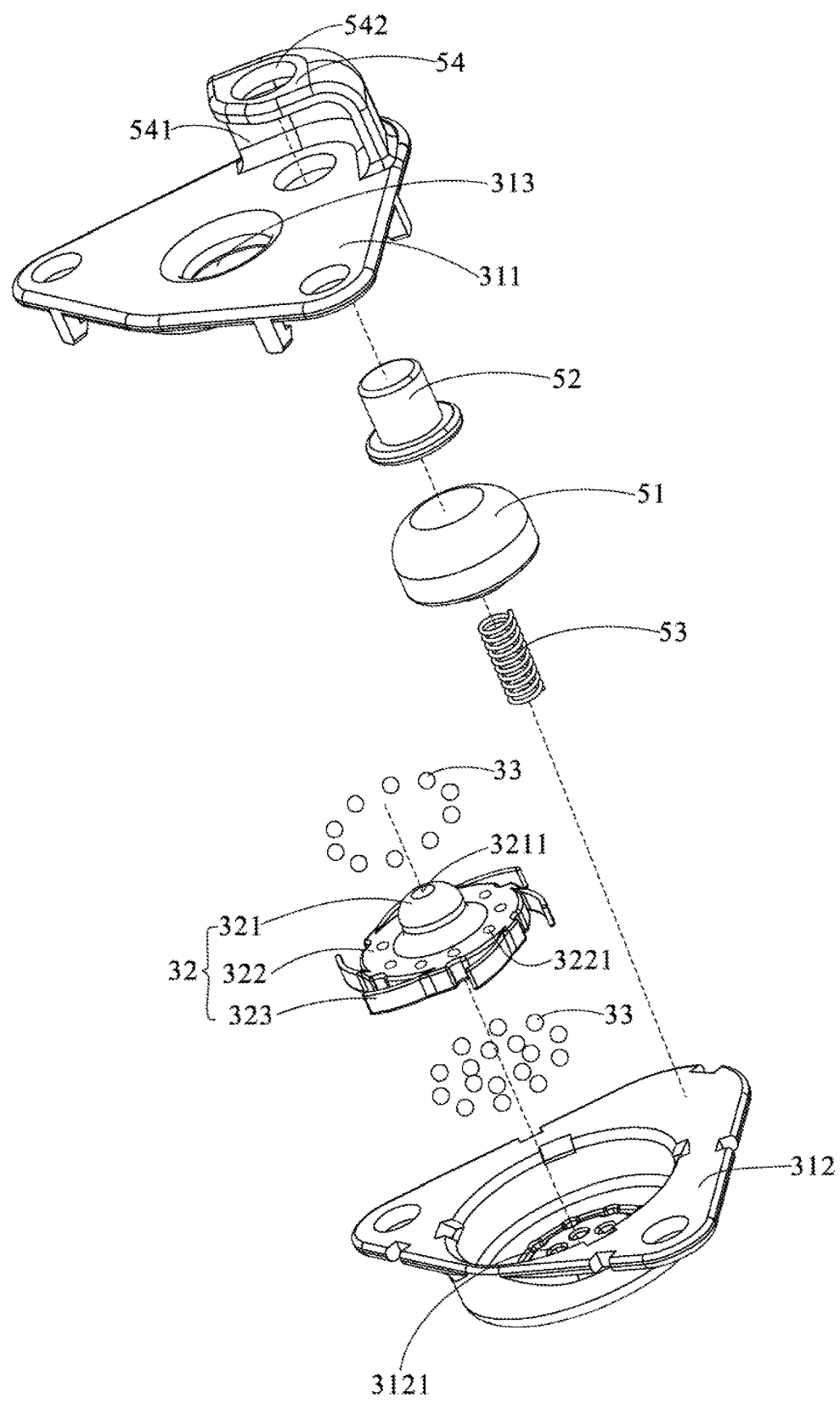
FIG. 3 is an explosive view of the positioning module and the supporting module of one embodiment of the present invention.
Figure 4:
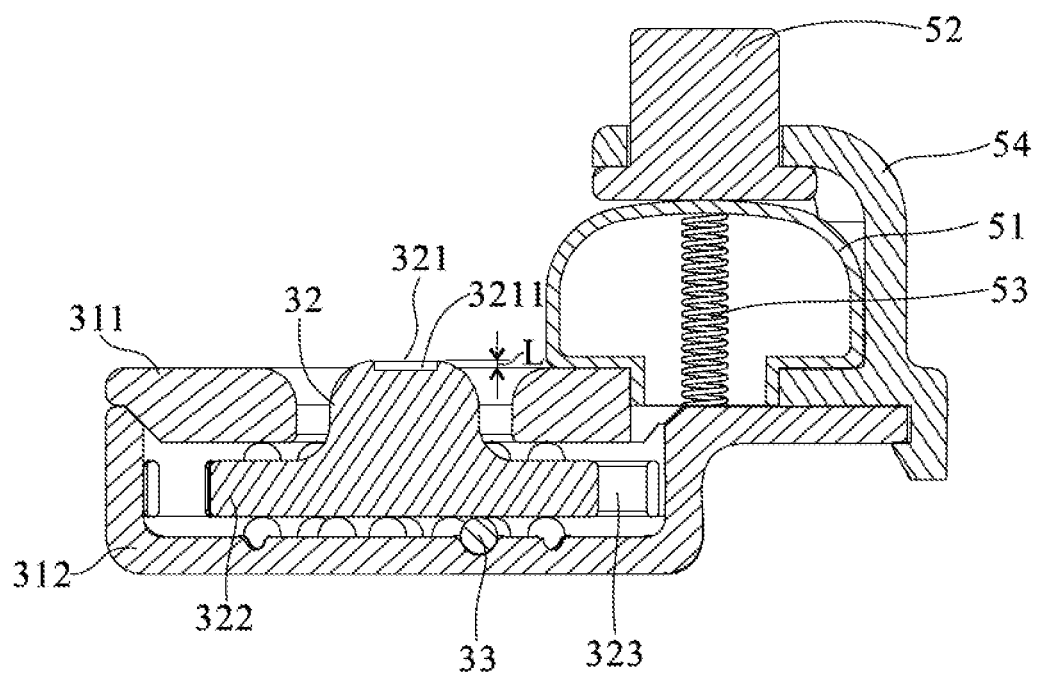
FIG. 4 is cross-section view of the positioning module and the supporting module of one embodiment of the present invention.

Particularly, please refer to the perspective view of the supporting module 5 and the positioning module 5 that illustrated in FIG. 2; the explosive view of the supporting module 3 and the positioning module 5 that illustrated in FIG. 3; and the cross-section view of the supporting module 3 and the positioning module 5 that illustrated in FIG. 4. The supporting 3 comprises a box 31, a supporting member 32, and a plurality of shifting member 33. Wherein the box 31 includes the cover body 311, a main body 312, and an opening 313 formed on the cover body 311; the supporting member 32 includes a protruding part 321, a body part 322, and six spacers 323. The protruding part 321 is formed on one surface of the body part 322, and the spacer 323 is formed on a side surface of the main body 322. The supporting member 32 is accommodated in the box 31 with a portion of the protruding part 321 protrudes out from the opening 313 of the box 31 and extend over the base 1 for about 0.1 mm. The shifting members 33 are disposed between the body part 322 and the box 31. More specifically, a plurality of balls, which serves as shifting members 33, are disposed between the body part 322 of the supporting member 32 and the main body 312 of the box 31, and between the body part 322 of the supporting member 32 and the cover body 311 of the box 311. A plurality of first ball slots 3221 are formed at the body part 322 of the supporting member 32; and a plurality of second ball slots 3121 are formed at the bottom of the main body 312 of the box 31 for accommodating the balls. Also, a plurality of dust extraction channels 314 is formed beneath each of the second ball slots 3121, interconnect to the second ball slots 3121 and extend through the bottom of the main body 312. In addition, one end of the spacer 323 away from the body part 322 abuts against the inner surface of the box 31 for maintaining the gap between the body part 322 and the box 31 horizontally. Furthermore, the locators 6 are disposed on the cover body 311 of the box 31 in pairs.

Furthermore, the positioning module 5 is disposed on a cover body 311 of the supporting module 3 and comprises a soft member 51, an abutting member 52, an elastic component 53, and a shell 54. The shell 54 has a first opening 541 and a second opening 542, wherein the first opening 541 faces toward the reticle 4, the soft member 51 is disposed inside the shell 54, and a portion of the soft member 51 exposed from the first opening 541 and a portion of the soft member 51 is covered by the shell 54 from above. In addition, the abutting member 52 is disposed above the soft member 51 and contact with the soft member 51, a portion of the abutting member 52 protruded out from the shell 54 through the second opening 542. Furthermore, the soft member 31 may have a hollow structure and may deform when a force is applied thereto. The elastic component 53 is disposed in the soft member 51 and may be compressed in a longitudinal direction.

The supporting member 32 further includes a contact element 3211 disposed on the top of the protruding part 321 for contacting the reticle 4. In order to prevent the dust particle generated by the displacement between the supporting member 32 and the reticle 4. Preferably, the contact element 3211 is made of a material with high static friction coefficient μ, so that the maximum static friction between the reticle 4 and the contact element 3211 is greater than a horizontal force applied to the supporting member 32 via the reticle 4. In the present embodiment, the supporting member 32 is made of PEEK, the contact element 3211 is made of silicone, and the arithmetic mean roughness value Ra of the contact element 3211 is 8-25 μm.

However, in other embodiment, the contact element 3211 is not necessarily included in the supporting member 32, the reticle 4 may contact directly with the protruding part 321 as illustrated in FIG. 6 to FIG. 9. The maximum static friction between the reticle 4 and the protruding part 321 should also be greater than a horizontal force applied to the supporting member 32 via the reticle 4, and the arithmetic mean roughness value Ra of the protruding part should also be 8-25 μm.

Figure 5:
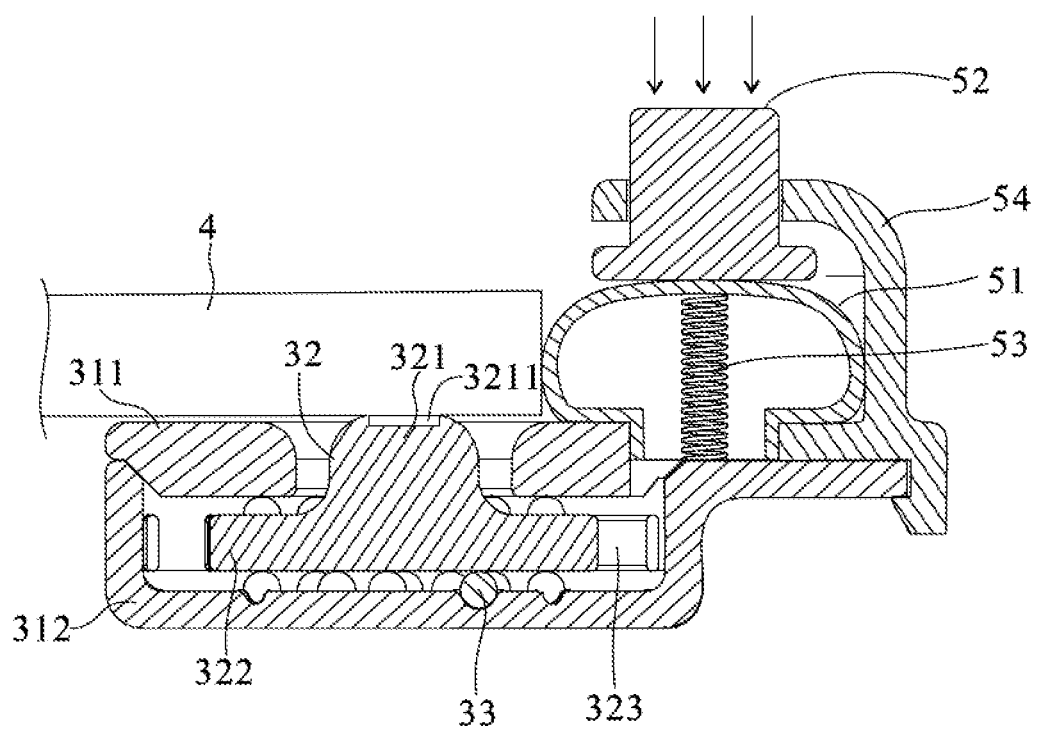
FIG. 5 is cross-section view of the positioning module and the supporting module of one embodiment of the present invention.
Figure 6:
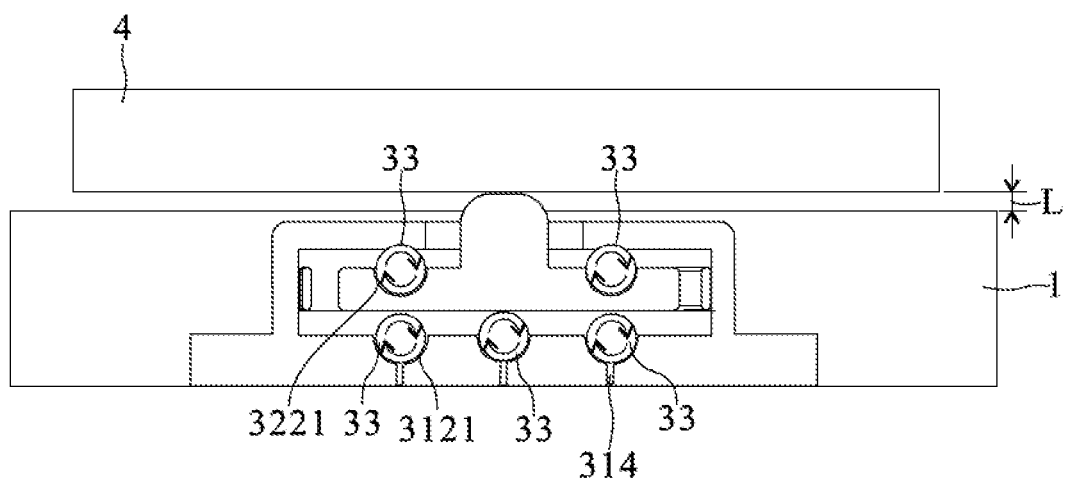
FIG. 6 is a schematic diagram of the supporting module of one embodiment of the present invention.

According to the abovementioned structural description, when the reticle 4 is placed on the base 1, the locators 6 disposed in pairs at each of the vertex portion 11 may contact two sides of the reticle 4 to make sure that the reticle 4 is placed at a predetermined position. Refer to FIG. 5, the reticle, when the reticle 4 is placed on the base 1, the reticle 4 does not contact directly with the base 1. The reticle 4 is supported by and contacts with four supporting module 3 disposed at four vertex portion 11. Please refer to FIG. 6 illustrating the partially enlarged image of the supporting module 3 wherein the supporting module 3 contacts with the reticle 4 through the protruding part 321 so that a gap L of 0.1 mm may be maintained between the reticle 4 and the base 1 to avoid collisions. In addition, a plurality of balls serving as shifting members 33 are disposed between the body part 322 of the supporting member 32 and the main body 312 of the box 31 so that the supporting member 32 may move horizontally with respect to the box 31 without collision, and the spacers 323 may maintain the gap between supporting member 32 and the box 31. Accordingly, if the displacement of the reticle 4 occurs due to collision when the reticle 4 is accommodated in the reticle pod 1000, the supporting member 32 contacting with the reticle 4 may slightly shift in the horizontal direction with the reticle 4, therefore, damages caused by or dust particles generated by the friction between the protruding part 321 of the supporting member 32 and the reticle 4 may be avoided.

Additionally, when the balls roll in the first ball slots 3121 or the second ball slots 3221, dust particles may be generated by the friction between the balls and the ball slots 3121, 3221, at the meantime, the dust particles may be discharged out of the reticle pod 1000 through the dust extraction channels 314 to avoid contamination of the reticle 4.

Figure 7:
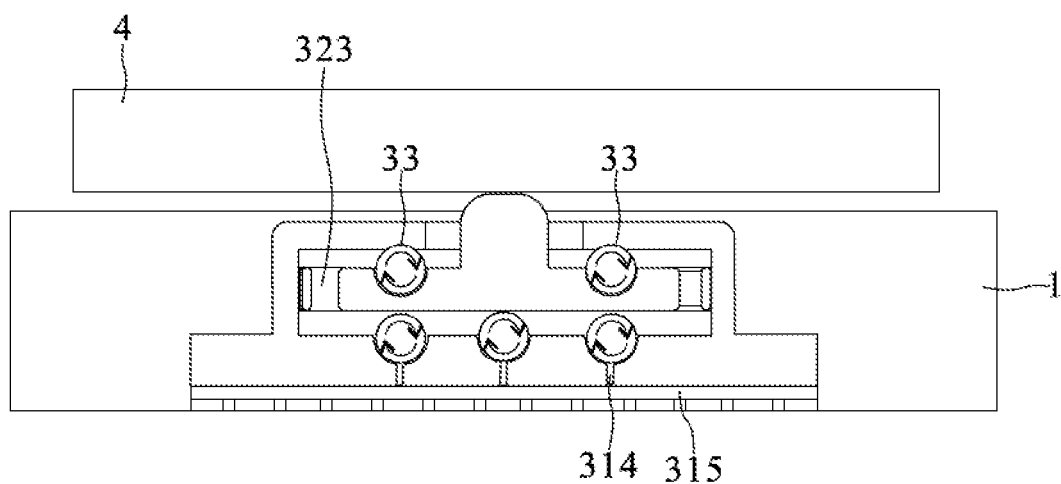
FIG. 7 is a schematic diagram of the supporting module of another embodiment of the present invention.

Furthermore, as illustrated in FIG. 7, a filter 315 may be disposed at the exit of the dust extraction channels 314 to separate the outer and the inner of the reticle pod 1000 interconnected by the extraction channels to avoid contaminates enter into the reticle 4.

Furthermore, when the cover 2 covers the reticle 4 from above and engages to the base 1, the cover 2 contacts and abuts against the abutting member 52 and provides a downward pressure to the abutting member 52, wherein the direction of the downward pressure is shown by the arrow in FIG. 5. The abutting member 52 applies a pressure in a longitudinal direction to compress the soft member 51 and the elastic component 53 inside the soft member 51. The compressed and deformed soft member 51 contact with the reticle 4 in a horizontal direction, and the deformation elongation of the soft member is 0.1 mm to 3.0 mm in the horizontal direction. Accordingly, four of the soft members 51 disposed respectively at four vertex portions 11 are in contact with four corners of the reticle 4 and provide a thrust against the reticle 4 to fix the reticle 4. Due to the softness of the soft members 51, the soft members 51 may serve as a shock absorber for the reticle 4 to avoid displacement or collision of the reticle 4 during the relocating processes of the reticle pod 1000.

In the present embodiment, the cover 2 further comprises a plurality of top abutting member (not shown in figures). The top abutting member abuts against the reticle 4 from above and fixes the reticle 4 when the cover 2 covers the reticle 4 from above and engages to the base 1. The weight of the reticle 4 is 0.6 kg and the downward pressure provided by the top abutting member is 3 kg, therefore, the total weight applied on the supporting member 32 is 3.6 kg. Generally, there should be no replacement between the reticle 4 and the supporting member 32 when the maximum acceleration of the reticle 4 reaches 40 m/s² in the horizontal direction. Therefore, according to Newton's second law of motion F=ma; and the friction formula $f_s=\mu N$, the minimum friction coefficient between the contact element 3211 and the reticle 4 $\mu > 4.08$. However, in other embodiments, the weight of the reticle 4 and the downward pressure applied by the top abutting member may be different; therefore, the minimum friction coefficient is not limited to 4.08, and is preferably in the range of 0.5 to 6.

However, in other embodiment, the shifting members may be cylinders, wheels, or liquid so that the supporting member may shift with respect to the box. For instance, when the shifting members are wheels, those wheels may be disposed between the body part and the box. Also, a plurality of rolling grooves may be formed on the body part or the box correspondingly to those wheels, so that the wheels may roll in those rolling grooves. Therefore, the body part and the box may shift correspondingly through the wheels. Alternatively, when the shifting members are cylinders, a plurality of grooves may be formed on the body part or the box for accommodating those cylinders so that those cylinders may roll in those grooves. Therefore, the body part and the box may shift correspondingly through those cylinders.

Embodiment 2

Figure 8:
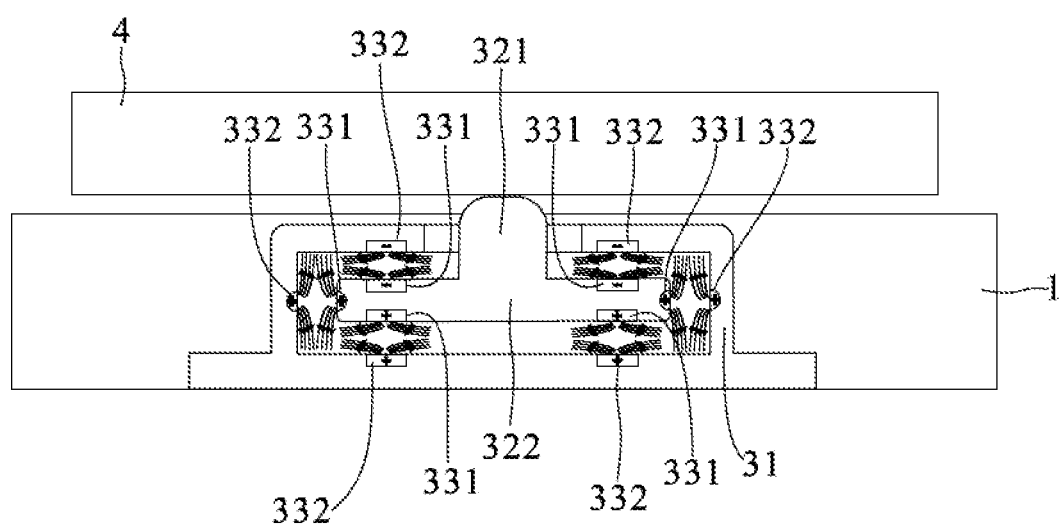
FIG. 8 is a schematic diagram of the supporting module of another embodiment of the present invention.

The reticle pod of the present embodiment is similar to that of the Embodiment 1, except that two opposing surfaces of the body part 322 of the supporting member 32 and the box 31 are disposed correspondingly with a first magnetic element 331 and a second magnetic element 332 respectively as the shifting members 33. For instance, as illustrated in FIG. 8, three first magnetic elements 331 are disposed on the surface of body part 322, and three second magnetic elements 332 are disposed on the surface of the box 31 with respect to the first magnetic elements 331. The first magnetic elements 331 and the second magnetic elements 332 are magnetically repulsive to each other. Alternatively, in other embodiment, the first magnetic element 331 and the corresponding second magnetic element 332 may be magnetic attractive, which is not particularly limited. The supporting member 32 may not contact to the box 31 due to the repulsive force between the first magnetic element 331 and the second magnetic element 332, and the supporting member 32 may slightly shift horizontally with respect to the box 31. Accordingly, displacement or collision of the reticle 4 and dust particles caused by displacement or collision during the relocating processes of the reticle pod 1000 may be avoided.

Embodiment 3

Figure 9:
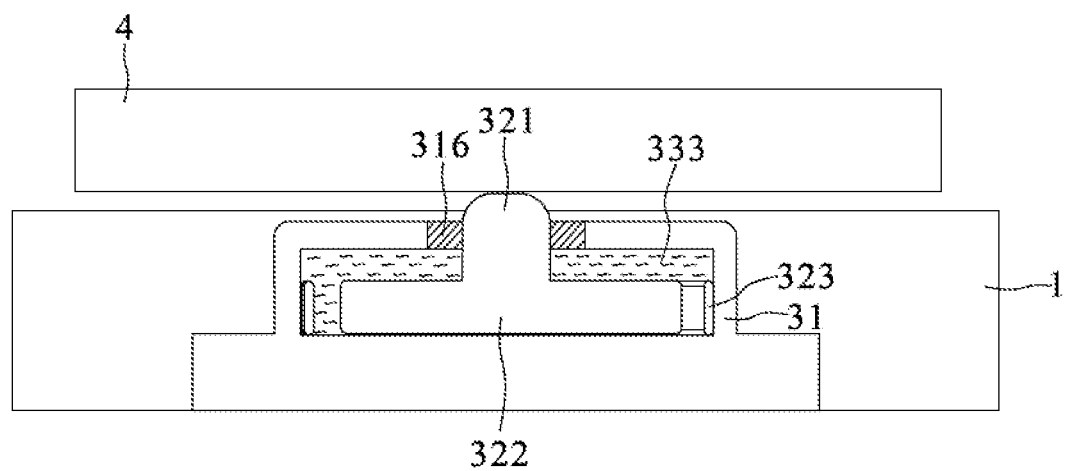
FIG. 9 is a schematic diagram of the supporting module of another embodiment of the present invention.

The reticle pod of the present embodiment is similar to that of the Embodiment 1, except that a fluid 333 is filled between the box 31 and the supporting member 32 as a shifting member. Refer to FIG. 9, the box 31 is filled with the fluid 333, and the box 31 further includes a sealing member 316 disposed at the opening 313. The sealing member 316 surrounds the opening 313 and tightly abuts the protruding part 321 to avoid leakage of the fluid 333. In the present embodiment, the fluid 333 may be hydraulic oil, lubricating oil, mercury, or mixture thereof. Together with the spacers 323 disposed on the side surface of the body part 322, a gap may be maintained between the side surface of the body part 322 and the box 31. The fluid 333 filled between the body part 322 and the box 31 provides a lubrication effect therebetween, therefore, the supporting member 32 may slightly shift horizontally with respect to the box 31. Accordingly, displacement or collision of the reticle 4 and dust particles caused by displacement or collision during the relocating processes of the reticle pod 1000 may be avoided.

Accordingly, the reticle pod provided by the present invention may accurately locate the position of the reticle in the reticle pod and may prevent the horizontal or longitudinal displacement of the reticle caused by vibration. Also, the dust particles generated by the frictions between the reticle and the reticle pod may be efficiently reduced to ensure the cleanness and quality of the reticle.

Although the present invention has been explained in relation to its preferred embodiment, it is to be understood that many other possible modifications and variations can be made without departing from the spirit and scope of the invention as hereinafter claimed.

What is claimed is:

1. A reticle pod for receiving a reticle, which comprises:
   a base;
   a cover corresponding to the base and engaging with respect to the base; and
   at least one supporting module disposed on the base, which includes a box having an opening; a supporting member having a protruding part and a main body and disposed in the box with a portion of the protruding part protrudes out of the box through the opening; and a plurality of shifting members being disposed between the box and the main body; wherein the supporting member moves relative to the box in a horizontal direction via the shifting members;
   when the reticle is received inside the reticle pod, the supporting module abuts against the reticle through the protruding part; and a maximum static friction between the reticle and the protruding part is greater than a horizontal force applied to the protruding part via the reticle.

2. The reticle pod as claimed in claim 1, wherein a coefficient of friction µ between the protruding part and the reticle is 0.5-6.

3. The reticle pod as claimed in claim 1, wherein an arithmetic mean roughness value Ra of the protruding part is 8-25 µm.

4. The reticle pod as claimed in claim 1, wherein friction or displacement between the supporting member and the reticle does not occur.

5. The reticle pod as claimed in claim 1, wherein the supporting member is made of a plastic material which is selected from the group consisting of polyvinyl chloride (PVC), poly (methyl methacrylate) (PMMA), polystyrene (PS), polyamide (PA), polyethylene (PE), polytetrafluoroethylene (PTFE), polypropylene (PP), acrylonitrile-butadiene-styrene copolymer (ABS), phenol formaldehyde resin (PF), urea resin (UF), melamine resin (MF), unsaturated polyester (UP), epoxy resin (EP), polyurethane (PU), polycarbonate (PC), polybutylene terephthalate (PBT), Nylon-66 (PA-66), Nylon-6 (PA-6), polyoxymethylene (POM), polyphenylene sulfide (PPS), polyether ether ketone (PEEK), polyamide-imide (PAI), polyetherimide (PEI), polyimide (PI), and mixture thereof.

6. The reticle pod as claimed in claim 5, wherein the supporting member is made of polyether ether ketone (PEEK).

7. The reticle pod as claimed in claim 1, wherein the supporting member further comprises a contact element disposed on the top of the protruding part for contacting the reticle, wherein a coefficient of friction µ between the contact element and the reticle is 0.5-6; and an arithmetic mean roughness value Ra of the contact element is 8-25 µm.

8. The reticle pod as claimed in claim 7, wherein the contact element is made of silicone.

9. The reticle pod as claimed in claim 1, wherein when the reticle is received in the reticle pod, the reticle does not contact with the base and a gap between the reticle and the base is 0.05-0.3 mm.

10. The reticle pod as claimed in claim 6, wherein the gap between the reticle and the base is 0.1 mm.

11. The reticle pod as claimed in claim 1, wherein the shifting members are balls, and ball slots corresponding to each of the balls are formed on the box or the main body of the supporting element for the balls to be embedded thereinto.

12. The reticle pod as claimed in claim 1, wherein the shifting members are cylinders, and cylinder slots corresponding to each of the cylinders are formed on the box or the main body of the supporting element for cylinders to be embedded thereinto.

13. The reticle pod as claimed in claim 1, wherein the shifting members are rollers disposed on the box or the main body, and between the box and the supporting element.

14. The reticle pod as claimed in claim 11, wherein the box further includes a plurality of dust extraction channels extends through a bottom side of the box.

15. The reticle pod as claimed in claim 14, further comprising a filter membrane disposed on the bottom side of the box and covering the dust extraction channels from underneath.

16. The reticle pod as claimed in claim 9, wherein the shifting member is a fluid, the fluid is accommodated in the box, the reticle pod further comprises a sealing member disposed at the opening of the box so that the fluid does not leak from the opening.

17. The reticle pod as claimed in claim 16, wherein the fluid is selected from the group consisting of hydraulic oil, lubricating oil, mercury, and mixture thereof.

18. The reticle pod as claimed in claim 1, wherein each of the shifting members is configured with a first magnetic element and a second magnetic element, wherein the first magnetic element and the second magnetic element in each of the shifting member are magnetically attracted or repulsive in order to separate the supporting member and the box.

19. The reticle pod as claimed in claim 1, wherein the supporting member further comprises at least one spacer formed on a side surface of the main body and contact the box to separate the main body and the box.

20. The reticle pod as claimed in claim 19, wherein the spacer is made of an elastic material.

* * * * *